United States Patent
Tsai (10) Patent No.: US 7,135,901 B2
(45) Date of Patent: Nov. 14, 2006

(54) DATA RECOVERY DEVICE USING A SAMPLING CLOCK WITH A HALF FREQUENCY OF DATA RATE

(75) Inventor: Leif Tsai, Taipei (TW)

(73) Assignee: VIA Technologies, Inc., Taipei (TW)

( * ) Notice: Subject to any disclaimer, the term of this patent is extended or adjusted under 35 U.S.C. 154(b) by 130 days.

(21) Appl. No.: 10/929,436

(22) Filed: Aug. 31, 2004

(65) Prior Publication Data

US 2005/0116750 A1    Jun. 2, 2005

(30) Foreign Application Priority Data

Dec. 1, 2003    (TW) ............................. 92133706 A (51) Int. Cl.
    *H03L 7/06*    (2006.01)
(52) U.S. Cl. ...................... 327/156; 327/157; 375/376
(58) Field of Classification Search ................ 327/156, 327/157; 375/376
    See application file for complete search history.

(56) References Cited

U.S. PATENT DOCUMENTS

| 6,442,225 | B1 * | 8/2002 | Huang ......................... 375/376 |
| 2004/0114632 | A1 * | 6/2004 | Yuuki et al. ................ 370/503 |
| 2004/0141577 | A1 * | 7/2004 | Brunn et al. ................ 375/376 |

* cited by examiner

*Primary Examiner*—Quan Tra
(74) *Attorney, Agent, or Firm*—Bacon & Thomas, PLLC (57) ABSTRACT

A data recovery device using a sampling clock with a half frequency of data rate is disclosed, which includes a phase detection circuit, a charge pump and a double clock frequency oscillation circuit. The phase detection circuit receives a data signal and a first clock signal for generating an up-adjustment signal and a down-adjustment signal. The charge pump generates a control voltage in accordance with the up- and down-adjustment signals. The double clock frequency oscillation circuit receives the control voltage for generating the first clock signal with adjustment phase. The invention uses the sampling clock with a half frequency of the data rate not only reduces the die size, but also reduces the power consumption.

17 Claims, 8 Drawing Sheets

DATA RECOVERY DEVICE USING A SAMPLING CLOCK WITH A HALF FREQUENCY OF DATA RATE

BACKGROUND OF THE INVENTION

1. Field of the Invention

The present invention relates to the technical field of clock data recovery and, more particularly, to a data recovery device using a sampling clock with a half frequency of data rate.

2. Description of Related Art

The first generation ATA (Advanced Technology Attachment) structure includes a clock data recovery (CDR) internally having a clock generator with a voltage-controlled oscillator (VCO). The VCO outputs eight clock signals with different phases and a same oscillation frequency of 375 MHz. Next, a quadruple clock frequency circuit receivers the 375 MHz clock signals for processing them by 4× and accordingly outputs a 1.5 GHz clock signal for reading a 1.5 GHz data signal. When the serial ATA structure advanced from the first generation to the second generation, the frequency of data signal increased from 1.5 GHz to 3 GHz and thus the operating frequency of clock signal was from 1.5 GHz to 3 GHz for latching the data. At this point, the VCO has to generate eight clock signals with different phases and a same oscillation frequency of 750 MHz. Next, a quadruple clock frequency circuit processes the 750 MHz clock signals for generating a 3.0 GHz clock signal.

However, due to the 3.0 GHz clock signal, the VCO requires driving each stage circuit in a shorter time for generating the aforementioned eight clock signals with different phases and the same oscillation frequency of 750 MHz. Thus, using an element with higher driving capability is required, which relatively increases area of the VCO and its power consumption also relatively increases with higher clock frequency.

Therefore, it is desirable to provide an improved clock data recovery device to mitigate and/or obviate the aforementioned problems.

SUMMARY OF THE INVENTION

The object of the present invention is to provide a data recovery device using a sampling clock with a half frequency of data rate, which applies a sampling clock at an operating frequency (1.5 GHz), which is half of a data rate (3 GHz), to read a full-rate data signal (3.0 GHz) and thus a higher operating frequency can be avoided to reduce die area, manufacturing cost and power consumption.

In accordance with a feature of the present invention, a data recovery device using a sampling clock with a half frequency of data rate is provided. The device includes a phase detection circuit, a charge pump and a double clock frequency oscillation circuit. The phase detection circuit receives a data signal and a first clock signal for generating a first up-adjustment signal and a first down-adjustment signal, wherein frequency of the data signal is double of the first clock signal. The charge pump generates two current in accordance with the first up-adjustment and down-adjustment signals and further outputs a control voltage. The double clock frequency oscillation circuit generates the first clock signal with adjustment phase in accordance with the control voltage.

In accordance with another feature of the present invention, a data recovery device using a sampling clock with a half frequency of data rate is provided. The device includes a phase detection circuit, a charge pump and a double clock frequency oscillation circuit. The phase detection circuit receives a data signal and a first clock signal for generating a first and a second up-adjustment signals and a first and a second down-adjustment signals, wherein frequency of the data signal is double of the first clock signal. The charge pump generates four current in accordance with the first and the second up-adjustment signals and the first and the second down-adjustment signals and further outputs a control voltage, wherein the second up-adjustment signal, the first and the second down-adjustment signals control the same current which is different from current of the first up-adjustment signal. The double clock frequency oscillation circuit generates the first clock signal with adjustment phase in accordance with the control voltage.

Other objects, advantages, and novel features of the invention will become more apparent from the following detailed description when taken in conjunction with the accompanying drawings.

DETAILED DESCRIPTION OF THE PREFERRED EMBODIMENT

When clock frequency is increased to 3.0 GHz, it causes relatively larger die size and power to result in operating problem. To overcome this, a data recovery device using a sampling clock with a half frequency of data rate (i.e., keeping clock frequency at 1.5 GHz) is provided. However, to latch a 3.0 GHz data signal properly, there is designed a fixed phase difference (preferably 90 degrees) between the 3.0 GHz data signal and the 1.5 GHz operating frequency of clock for steadily latching data, which is achieved by trigger on both edges of a clock.

Figure 1:
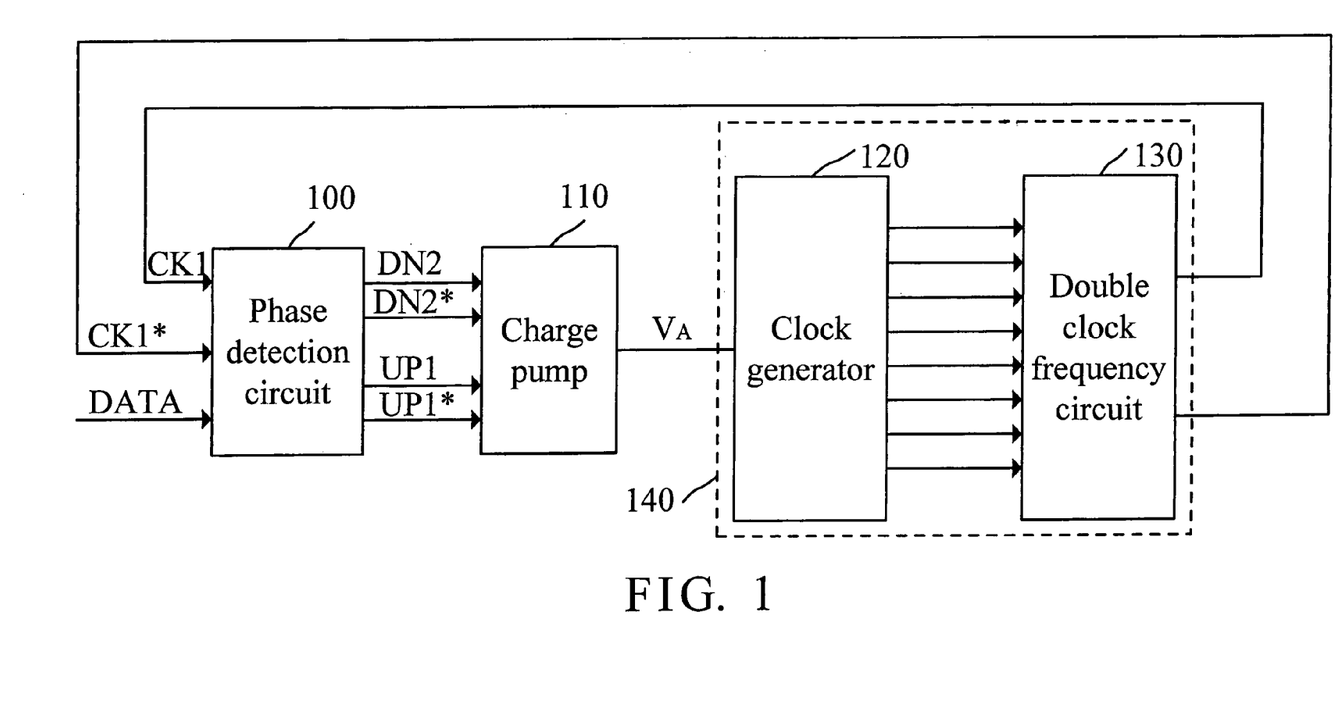
FIG. 1 is a block diagram of a data recovery device using a sampling clock with a half frequency of data rate in accordance with the invention.

FIG. 1 is a block diagram of a data recovery device using a sampling clock with a half frequency of data rate in accordance with the invention. As shown, the device includes a phase detection circuit 100, a charge pump 110, a clock generator 120 and a double clock frequency circuit 130. The phase detection circuit 100 receives a data signal DATA and first clock signals CK1 and CK1* and compares their phases for generating up-adjustment signals UP1 and UP1*, down-adjustment signals DN2 and DN2*. The signals UP1 and DN2 can control generating different currents for adjusting appropriate phase differences such that the first clock signals CK1, CK1* generated by the double clock frequency circuit 130 and the data signal DATA can automatically generate a fixed phase difference. Next, the charge pump 110 receives the up-adjustment signals UP1 and UP1*, the down-adjustment signals DN2 and DN2* for adjusting its internal current sources on or off, and accordingly the different currents are generated for outputting a control voltage $V_A$ respectively. The clock generator 120 receives the control voltage $V_A$ and accordingly generates eight second clock signals with different phases and same frequency of 375 MHz to output. The double clock frequency circuit 130 receives the second clock signals and accordingly generates first clock signals CK1 and CK1* with adjustment phase and frequency of 1.5 GHz. The circuits 120 and 130 can be combined into a double clock frequency oscillation circuit 140. In addition, any manner that the circuit 140 can generate the first clock signals CK1 and CK1* with desired adjustment phase and the frequency of 1.5 GHz can be used, not limit to the cited way that the clock generator 120 firstly generates eight clock signals with different phases and the same frequency.

Figure 2:
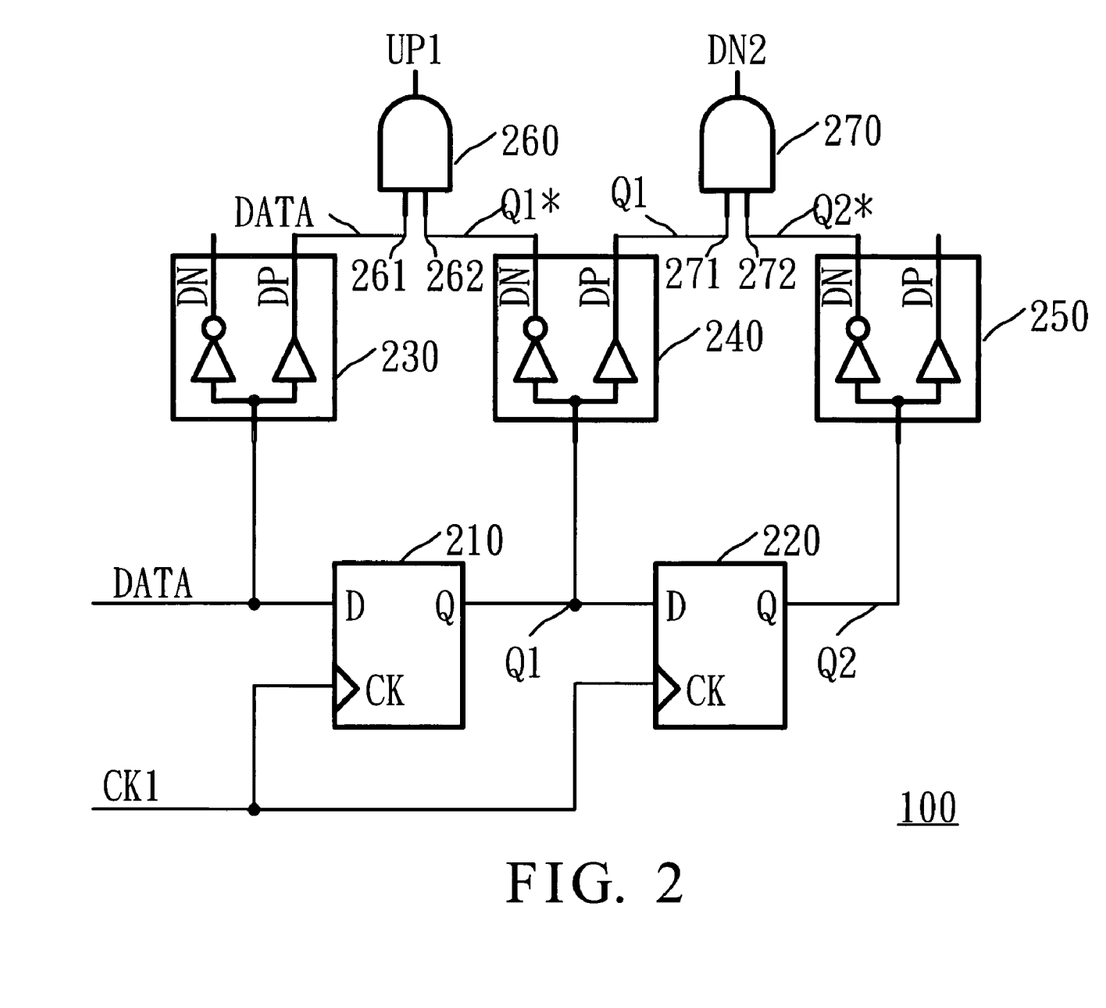
FIG. 2 is an internal circuit of a phase detection circuit in accordance with the invention.

FIG. 2 is a diagram of the phase detection circuit 100 of FIG. 1. As shown, the circuit 100 consists of a first and a second dual-edge trigger flip/flops 210 and 220, a first, a second and a third one-way differential circuits 230, 240 and 250, and a first and a second AND gates 206 and 270.

As shown in FIG. 2, the first dual-edge trigger flip/flop 210 has an input terminal for receiving the 3.0 GHz data signal DATA, a clock input terminal CK for receiving the first clock signal CK1, and an output terminal Q1 connected to input terminals of the second dual-edge trigger flip/flop 220 and the second one-way differential circuit 240. The second dual-edge trigger flip/flop 220 has a clock input terminal CK for receiving the first clock signal CK1, and an output terminal Q2 connected to an input terminal of the third one-way differential circuit 250.

The first one-way differential circuit 230 has an input terminal for receiving the signal DATA, and a non-inverted output terminal DP connected to a first input terminal 261 of the first AND gate 260. The first AND gate 260 has a second input terminal 262 connected to a inverted output terminal DN of the second one-way differential circuit 240. The second one-way differential circuit 240 has a non-inverted output terminal DP connected to a first input terminal 271 of the second AND gate 270. The second AND gate 270 has a second input terminal 272 connected to a inverted output terminal DN of the second one-way differential circuit 250. The first AND gate 260 has an output terminal for outputting the up-adjustment signal UP1. The second AND gate 270 has an output terminal for outputting the down-adjustment signal DN2.

Figure 3:
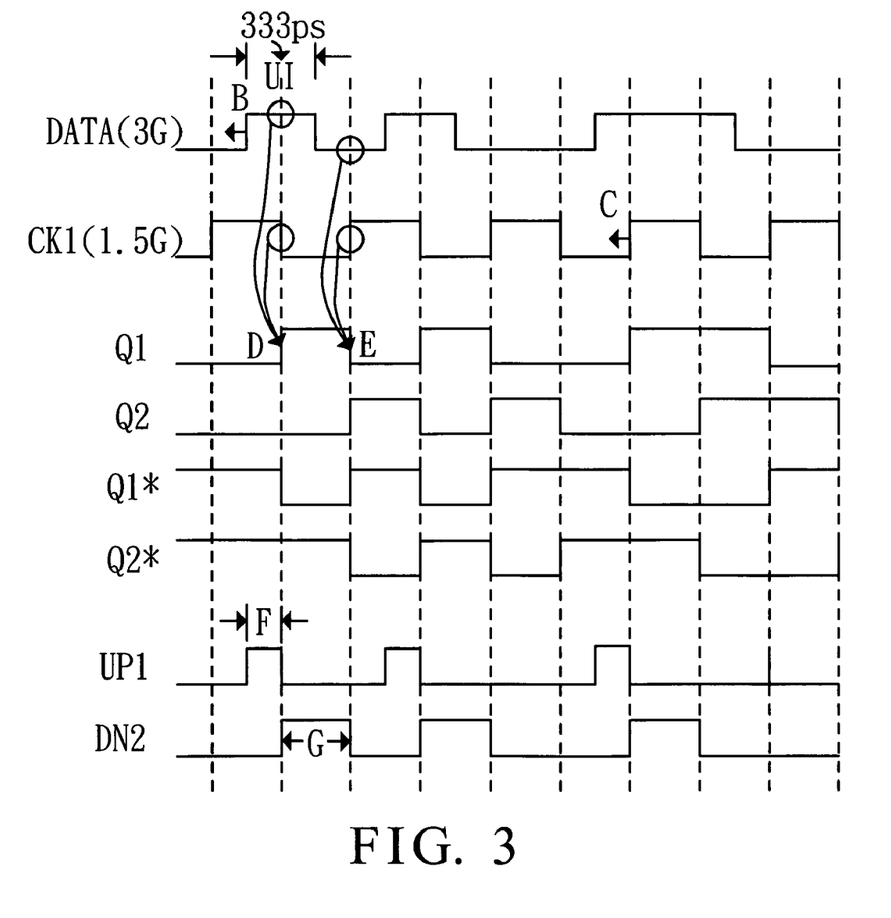
FIG. 3 is a timing diagram of the phase detection circuit of FIG. 2 in accordance with the invention.

FIG. 3 is a timing diagram of the phase detection circuit 100 of FIG. 2. In FIG. 3, the data signal DATA is transmitted at 3 GHz, so a data cycle is 333 ps. As shown, UI indicates a data cycle. The first clock signal CK1 is operated at 1.5 GHz, i.e., latching the DATA signal at half rate of the data signal DATA. As such, the first and the second dual-edge trigger flip/flops 210 and 220 in FIG. 2 can be triggered by the first clock signal CK1 at positive and negative edges, as shown at points D and E of FIG. 3. In this case, the signal Q1 can change with the data signal DATA at the positive and negative edges of the first clock signal CK1. The signal Q2 is half clock (CK1) delayed with respect to the signal Q1. Signals Q1* and Q2* are generated respectively by passing signals Q1 and Q2 through an inverter. The up-adjustment signal UP1 is generated by passing the signals DATA and Q1* through the first AND gate 260. The down-adjustment signal DN2 is generated by passing the signals DATA and Q2* through the second AND gate 270.

In order to steadily latch the data signal DATA at the clock signal CK1, positive and negative edges of the clock signal CK1 are fallen at its middle positions of the data signal DATA (as shown in FIG. 3, where positive and negative edges of two signals have 90-degree phase difference), such that current generated by the up-adjustment signal UP1 to the charge pump 110 is double of the down-adjustment signal DN2. Also, as shown in FIG. 3, the pulse width of high potential of the up-adjustment signal UP1 is half of the pulse width of low potential of the down-adjustment signal DN2, which adjusts the phase difference of signals CK1 and DATA to form a 90-degree to reach phase balance. The 90-degree phase difference can be changed to any fixed phase difference that can generate acceptable tolerance for steadily latching. The fixed phase difference is determined by current difference generated between the up- and down-adjustment signals UP1 and DN2 to the charge pump 110.

Figure 4:
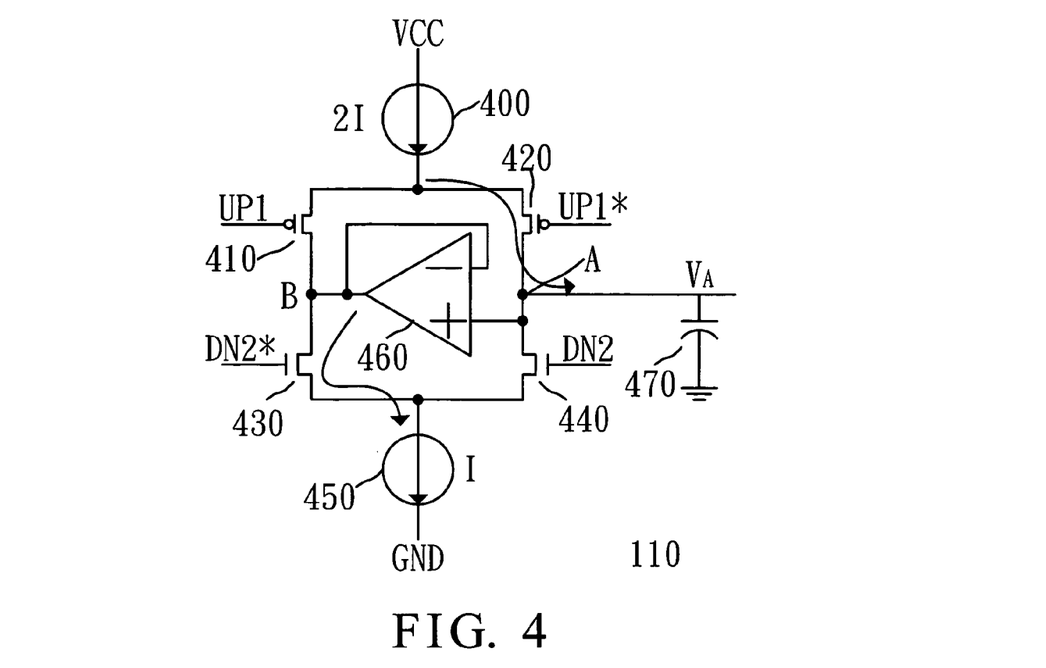
FIGS. 4 and 5 respectively are an internal circuit and related operation of a charge pump in accordance with the invention.

The function that current generated by the up-adjustment signal UP1 to the charge pump 110 is double of the down-adjustment signal DN2 can be obtained by the charge pump 110 of FIG. 4. As shown in FIG. 4, the charge pump 110 consists of a first current source 400, a first PMOS transistor 410, a second PMOS transistor 420, a third NMOS transistor 430, a fourth NMOS transistor 440, a second current source 450, an operational amplifier 460 and a capacitor 470. Current (2I) of the first current source 400 is double of the current (I) of the second current source 450.

When the up-adjustment signal UP1 is at high potential (point F of FIG. 3), the second PMOS transistor 420 and the third NMOS transistor 430 are turned on and the first PMOS transistor 410 and the fourth NMOS transistor 440 are turned off. At this point, current (2I) of the first current source 400 charges the capacitor 470 through the second PMOS transistor 420 such that a voltage $V_A$ at point A increases. Further, frequency of the second clock signal generated by the clock generator 120 increases and thus frequency of the first clock signal CK1 increases.

Figure 5:
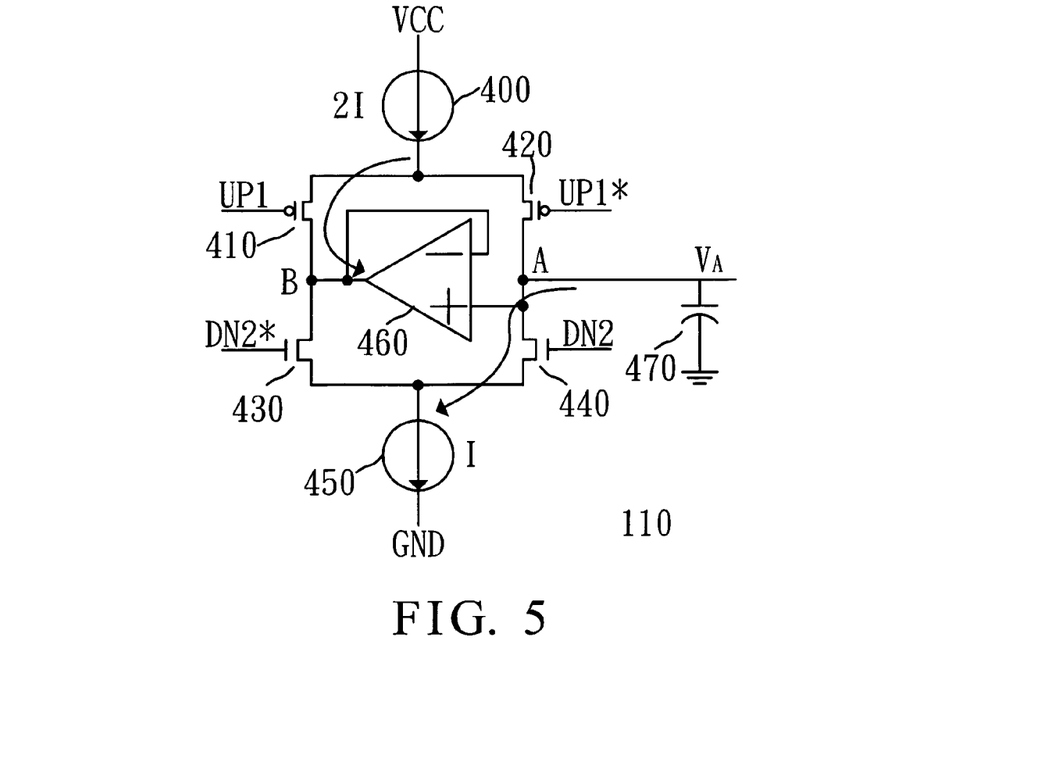

When the down-adjustment signal DN2 is at high potential (G of FIG. 3), the charge pump 110 is operated as shown in FIG. 5. The second PMOS transistor 420 and the third NMOS transistor 430 are turned off and the first PMOS transistor 410 and the fourth NMOS transistor 440 are turned on. At this point, current (2I) of the first current source 400 flows into the operational amplifier 460 through the first PMOS transistor 410. The capacitor 470 discharges (I) through the fourth NMOS transistor 440, which causes the voltage $V_A$ down and thus frequency of the first clock signal CK1 reduces. The voltage $V_A$ is proportional to frequency of the first clock signal CK1 as designed in the circuit of FIG. 4 or 5, but reverse proportion can alternatively be designed.

When the data signal DATA shown at point B of FIG. 3 drifts to left, the first clock signal CK1 lags behind the data signal DATA such that the pulse width of high potential of the up-adjustment signal UPI becomes larger to further increase the voltage $V_A$. As such, frequency of the second clock signal generated by the clock generator 120 increases to further increase frequency of the first clock signal CK1, which makes rising or falling edge of the first clock signal CK1 align to steady portion of the data signal DATA.

When the data signal DATA shown at point C of FIG. 3 drifts to right with respect to the CLK signal, the first clock signal CK1 falls in advance of the data signal DATA such that the pulse width of high potential of the up-adjustment signal UP1 becomes narrower so as to increase the voltage $V_A$ less. As such, frequency of the second clock signal generated by the clock generator 120 increases less so as to increase frequency of the first clock signal CK1 less, which makes rising or falling edge of the first clock signal CK1 align to steady portion of the data signal DATA.

Figure 6:
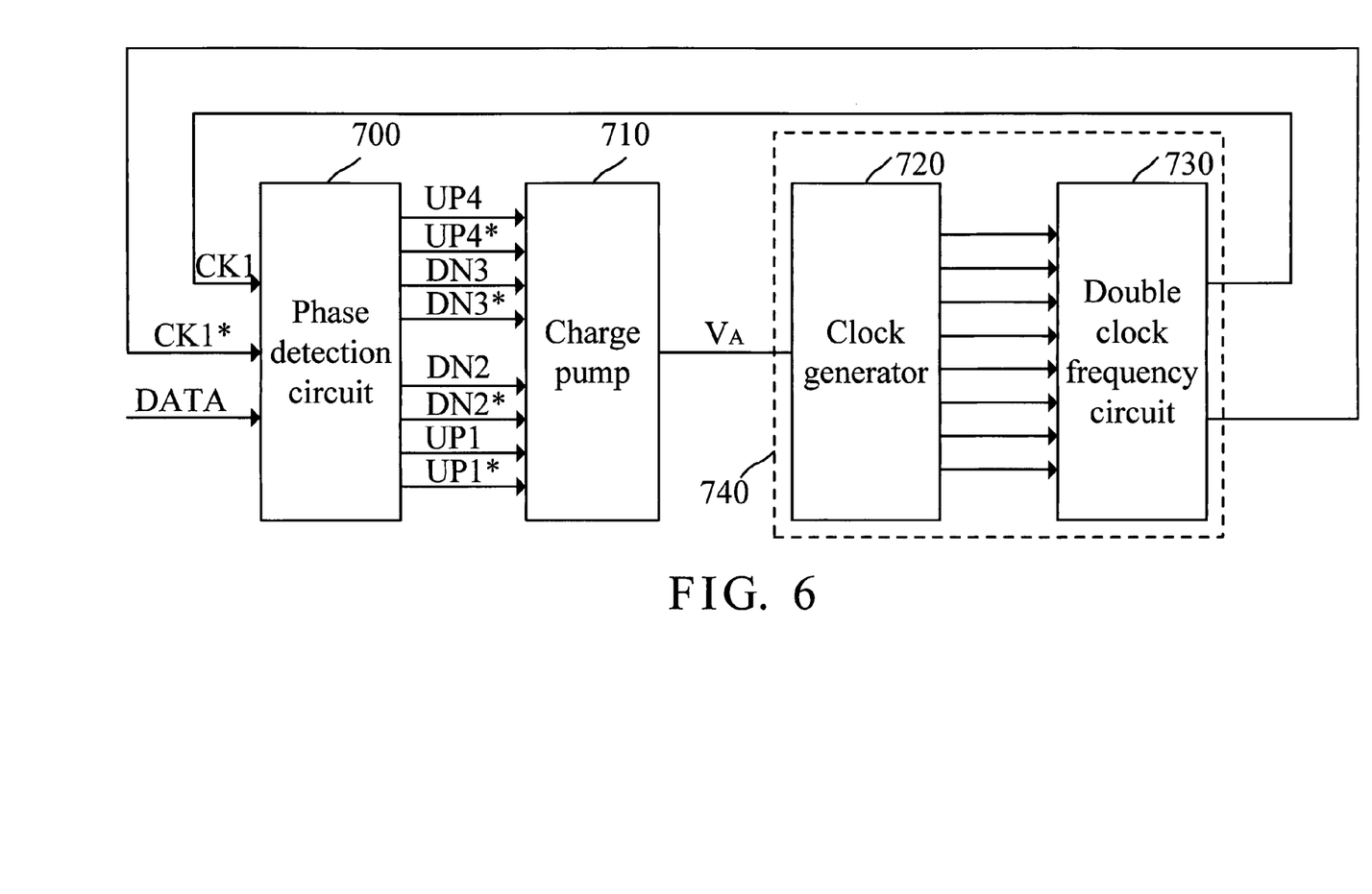
FIG. 6 is a block diagram of a data recovery device using a sampling clock with a half frequency of data rate in accordance with another embodiment of the invention.

As aforementioned, the phase detection circuit 100 generates the up-adjustment signal UP1 and the down-adjustment signal DN2, which may cause charge accumulation on point A of the charge pump 110 at long-term operation and thus cause drifting. To overcome this problem, FIG. 6 shows a block diagram of a data recovery device using a sampling clock with a half frequency of data rate in accordance with another embodiment of the invention. As shown, the device includes a phase detection circuit 700, a charge pump 710, a clock generator 720 and a double clock frequency circuit 730. The phase detection circuit 700 receives a data signal DATA and first clock signals CK1 and CK1* for comparing phases of the signal DATA and the signals CK1 and CK1* and accordingly generating first up-adjustment signals UP1 and UP1*, second down-adjustment signals DN2 and DN2*, third down-adjustment signals DN3 and DN3*, and fourth up-adjustment signals UP4 and UP4*. Similarly, the up-adjustment signals UP1 and UP4, and the down-adjustment signals DN2 and DN3 can control generating different currents in order to adjust the first clock signals CK1 and CK1* and the data signal DATA for generating appropriate phase differences.

The charge pump 710 adjusts its internal current sources on or off in accordance with first up-adjustment signals UP1 and UP1*, second down-adjustment signals DN2 and DN2*, third down-adjustment signals DN3 and DN3*, and fourth up-adjustment signals UP4 and UP4*, for generating the different currents and further outputting a control voltage $V_A$ respectively.

The clock generator 720 receives the control voltage $V_A$ for generating eight second clock signals with different phases and same frequency of 375 MHz to output. The double clock frequency circuit 730 receives the second clock signals and accordingly generates first clock signals CK1 and CK1* with adjustment phase and a frequency of 1.5 GHz. The circuits 720 and 730 can be combined into a double clock frequency oscillation circuit 740. In addition, any manner that the circuit 740 can generate the first clock signals CK1 and CK1* with desired adjustment phase and the frequency of 1.5 GHz can be used, not limit to the aforementioned way that the clock generator 720 firstly generates eight clock signals with different phases and the same frequency.

Figure 7:
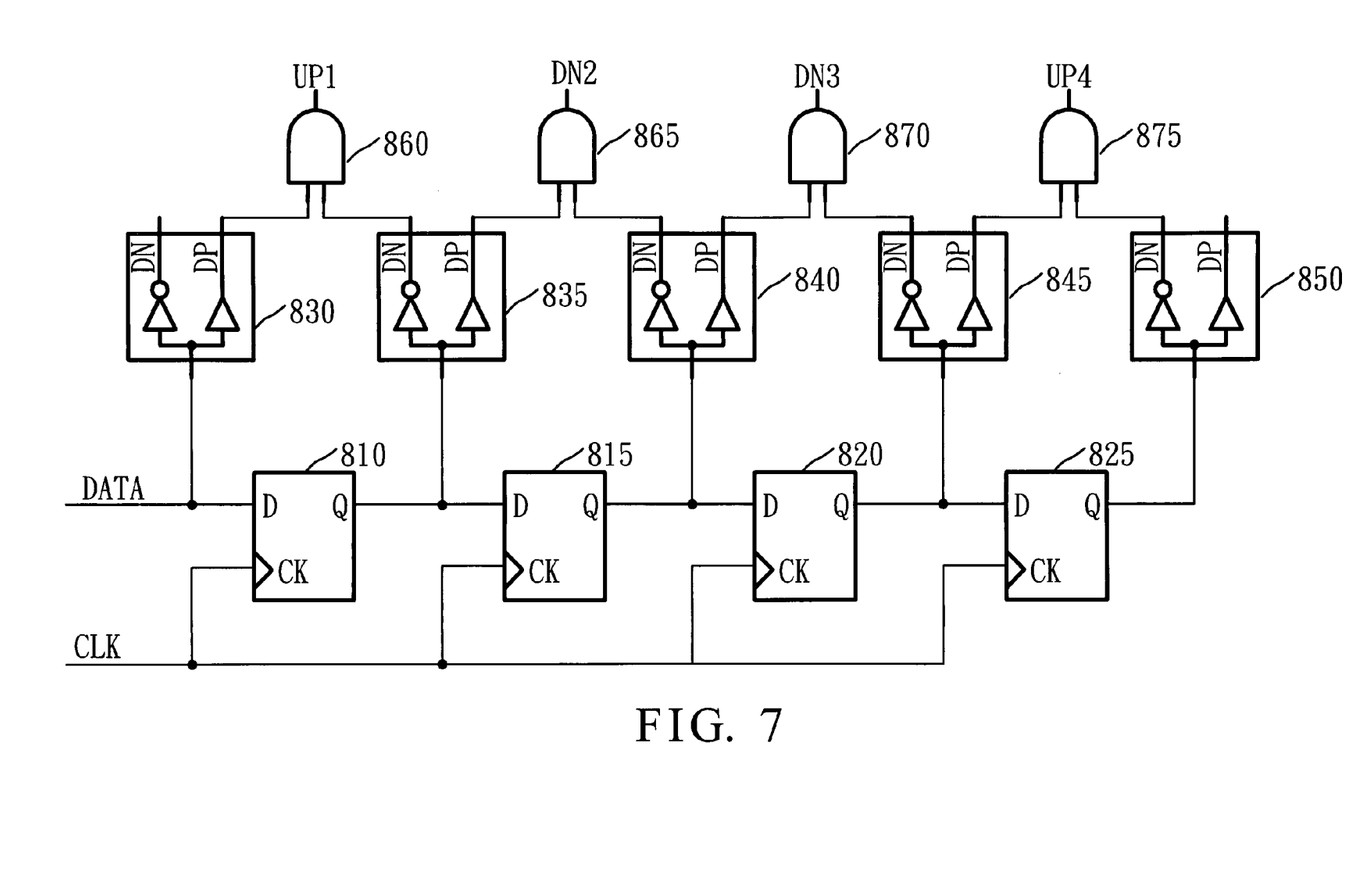
FIG. 7 is an internal circuit of a phase detection circuit in accordance with another embodiment of the invention.

FIG. 7 is an internal circuit of the phase detection circuit 700 of FIG. 6. As shown, the phase detection circuit 700 includes first to fourth -dual-edge trigger flip/flops 810, 815, 820 and 825, first to fifth one-way differential circuits 830, 835, 840, 845 and 850, and first to fourth AND gates 860, 865, 870 and 875, which have a circuit connection similar to that in FIG. 2, and thus a detailed description is deemed unnecessary.

Similarly, in order to design positive and negative edges of the clock signal CK1 to be fallen in middle positions of the data signal DATA where the circuit 700 shown in FIG. 7 can read the data signal DATA steadily, current generated by the up-adjustment signal UP1 to the charge pump 710 is double of the down-adjustment signal DN2, such that a 90-degree phase difference is formed. At this point, the third down-adjustment signal DN3 and the fourth up-adjustment signal UP4 control the same currents as the second down-adjustment signal DN2. When the aforementioned currents are changed, as shown in the timing diagram of FIG. 8, the pulse width of high potential of the up-adjustment signal UP1 is half of the pulse width of low potential of the down-adjustment signal DN2, which form a 90-degree phase difference to reach phase balance. The 90-degree phase difference can be adjusted to any fixed phase difference that can generate acceptable tolerance for steadily reading. The fixed phase difference is determined by current difference generated between the up- and down-adjustment signals UP1 and DN2 to the charge pump 710.

Figure 9:
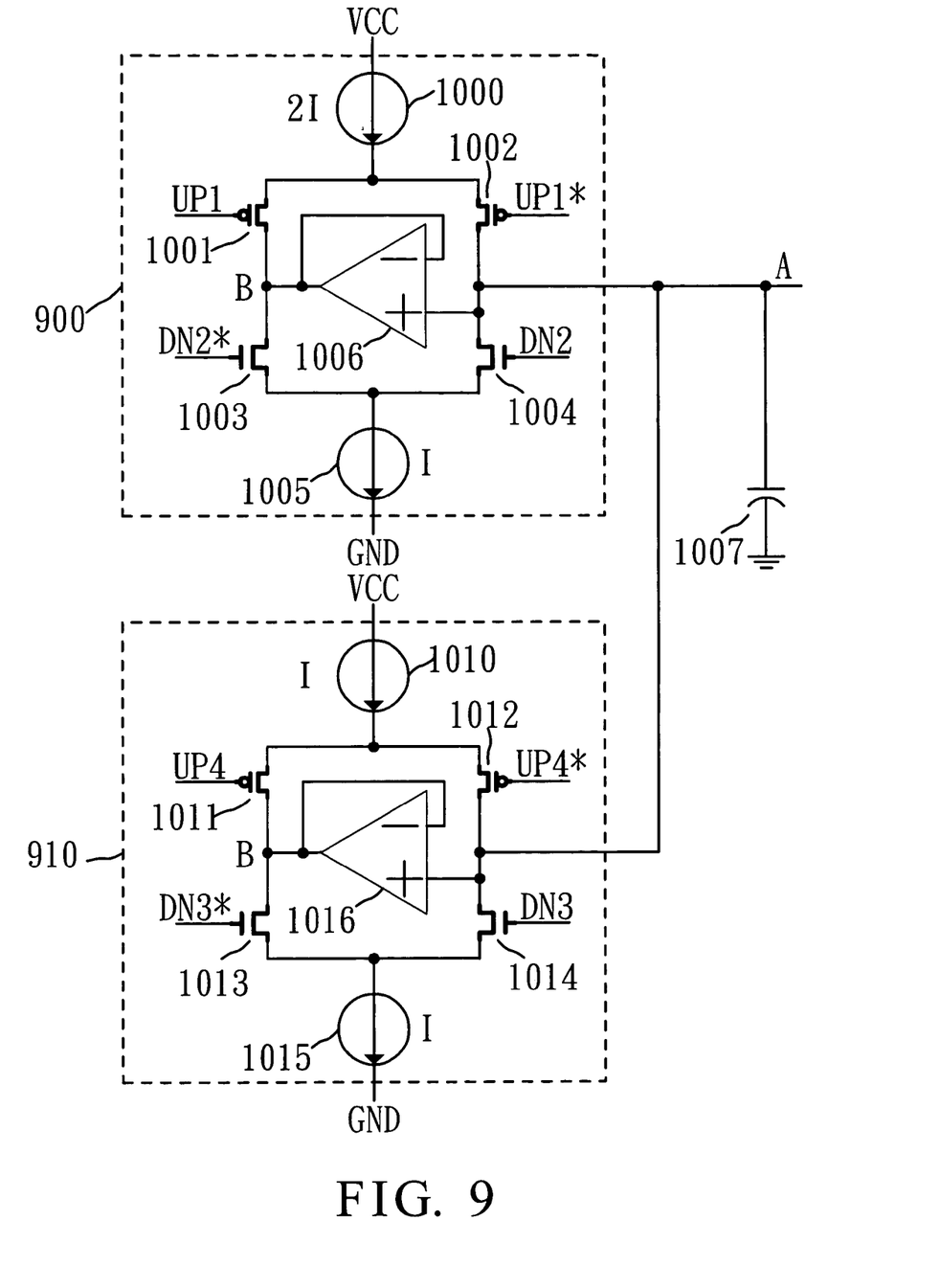
FIG. 9 is an internal circuit of a charge pump in accordance with another embodiment of the invention.

FIG. 9 is an internal circuit of the charge pump 710 of FIG. 6. As shown, the charge pump 710 has a first charge pump 900, a second charge pump 910 and a capacitor 1007. The first charge pump 900 consists of a first current source 1000, a first PMOS transistor 1001, a second PMOS transistor 1002, a third NMOS transistor 1003, a fourth NMOS transistor 1004, a second current source 1005, and a first operational amplifier 1006. The second charge pump 910 consists of a third current source 1010, a fifth PMOS transistor 1011, a sixth PMOS transistor 1012, a seventh NMOS transistor 1013, an eighth NMOS transistor 1014, a fourth current source 1015, and a second operational amplifier 1016. Current (2I) of the first current source 1000 is double of the current (I) of the current sources 1005, 1010 or 1015.

When the first up-adjustment signal UP1 is at high potential, the first charge pump 900 has the same operation as that of FIG. 4, i.e., current (2I) of the first current source 1000 charges the capacitor 1007 through the second PMOS transistor 1002 such that a voltage $V_A$ at point A increases. Further, frequency of the second clock signal generated by the clock generator 720 increases and thus frequency of the first clock signal CK1 increases.

When the second down-adjustment signal DN2 is at high potential, the first charge pump 900 has the same operation as that of FIG. 5, i.e., current (2I) of the first current source 1000 flows into the operational amplifier 1006 through the first PMOS transistor 1001. The capacitor 1007 discharges (I) through the fourth NMOS transistor 1004, which causes the voltage $V_A$ down and thus reduces frequency of the second clock signal generated by the clock generator 720, so that the first clock signal CK1 reduces.

When the third down-adjustment signal DN3 and the fourth up-adjustment signal UP4 are at high potential respectively, the second charge pump 910 has the same operation as that of FIGS. 4 and 5 respectively. In this embodiment, applying the third down-adjustment signal DN3 and the fourth up-adjustment signal UP4 can relatively alleviate drifting caused by the charge accumulation.

Figure 8:
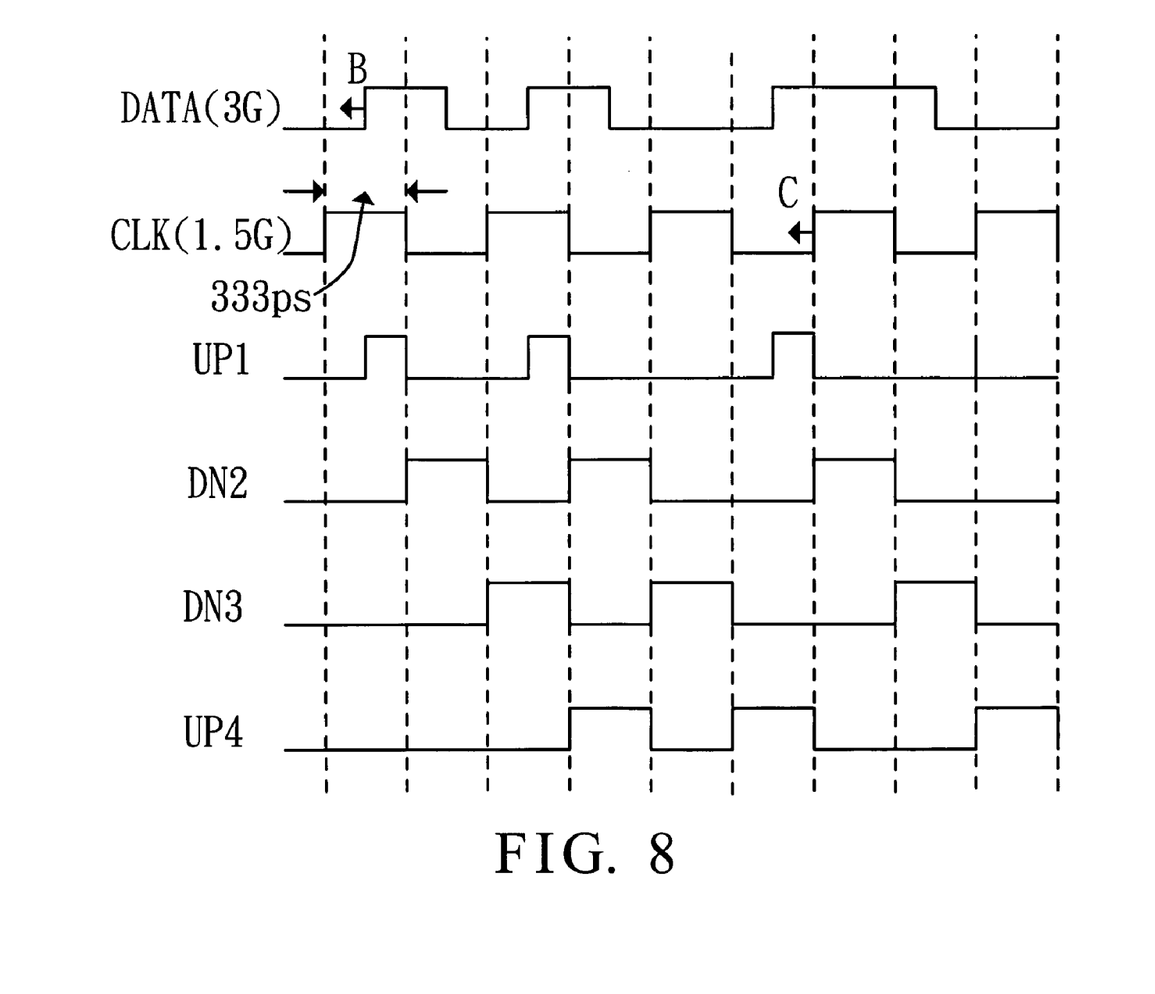
FIG. 8 is a timing diagram of the phase detection circuit of FIG. 7 in accordance with another embodiment of the invention.

When the data signal DATA shown at point B of FIG. 8 drifts to left, the first clock signal CK1 lags behind the data signal DATA such that the pulse width of high potential of the up-adjustment signal UP1 becomes larger to further increase the voltage $V_A$. As such, the frequency of the second clock signal generated by the clock generator 720 increases to further increase the frequency of the first clock signal CK1, which makes the rising or falling edge of the first clock signal CK1 align to steady portion of the data signal DATA.

When the data signal DATA shown at point C of FIG. 8 drifts to right with respect to the CLK signal, the first clock signal CK1 falls in advance of the data signal DATA such that the pulse width of high potential of the up-adjustment signal UP1 becomes narrower so as to increase the voltage $V_A$ less. As such, the frequency of the second clock signal generated by the clock generator 720 increases less so as to increase the frequency of the first clock signal CK1 less, which makes the rising or. falling edge of the first clock signal CK1 align to steady portion of the data signal DATA.

In view of foregoing, it knows that the invention can generate 90-degree phase shift via the 1.5 GHz first clock signal CK1, without the need of 3.0 GHz, for example. However, any half-clock-rate signal can be applied to latch a full-clock-rate data signal, not limited to the given example of 1.5 GHz, 3.0 GHz. Since the first clock signal CK1 is operated at 1.5 GHz that is half rate of 3.0 GHz, VCO device can drive every stage circuit by lower energy. Accordingly, VCO devices with poorer driving capability can be selected to reduce die size, and dynamic power consumption can be reduced to ¼ at full rate (in this case, 3.0 GHz) because the operating frequency is a half of the full rate, thereby saving power.

Although the present invention has been explained in relation to its preferred embodiment, it is to be understood that many other possible modifications and variations can be made without departing from the spirit and scope of the invention as hereinafter claimed.

What is claimed is:

1. A data recovery device using a sampling clock with a half frequency of data rate, comprising:
    a phase detection circuit, which receives a data signal and a first clock signal for generating a first up-adjustment signal and a first down-adjustment signal, wherein a frequency of the data signal is double a frequency of the first clock signal, and a current of the first up-adjustment signal is double a current of the first down-adjustment signal;
    a charge pump, which generates two currents in accordance with the first up-adjustment signal and the first down-adjustment signal and further outputs a control voltage; and
    a double clock frequency oscillation circuit, which generates the first clock signal with an adjustment phase in accordance with the control voltage.

2. The device as claimed in claim 1, wherein the charge pump further comprises:
    a first current source;
    a first PMOS transistor having a source connected to an output terminal of the first current source and a gate connected to the first up-adjustment signal;
    a second PMOS transistor having a source connected to the output terminal of the first current source and a gate connected to an inverted first up-adjustment signal;
    an operational amplifier having an input terminal connected to a drain of the second PMOS transistor, the other input terminal and an output terminal both connected to a drain of the first PMOS transistor;
    a first NMOS transistor having a drain connected to the output terminal of the operational amplifier and a gate connected to the first down-adjustment signal;
    a second NMOS transistor having a drain connected to the drain of the second PMOS transistor and a gate connected to inverted first down-adjustment signal;
    a second current source having an input terminal connected to sources of the first NMOS transistor and the second NMOS transistor, wherein the current of the first current source is double of the second current source; and
    a capacitor having one terminal connected to the ground and the other terminal connected to the drain of the second NMOS transistor, thereby generating the control voltage.

3. The device as claimed in claim 1, wherein the double clock frequency oscillation circuit further comprises:
    a clock generator, which outputs a plurality of second clock signals with different phases in accordance with the control voltage; and
    a double clock frequency circuit, which receives the second clock signals and accordingly generates the first clock signal with adjustment phase.

4. The device as claimed in claim 3, wherein a count of the second clock signals is 8.

5. The device as claimed in claim 3, wherein the double clock frequency circuit applies quadruple clock frequency to the second clock signals for generating the first clock signal with adjustment phase.

6. The device as claimed in claim 1, wherein the phase detection circuit comprises:
    a first dual-edge trigger flip/flop having an input terminal to receive the data signal and a clock input terminal to receive the first clock signal;
    a second dual-edge trigger flip/flop having an input terminal connected to an output terminal of the first both edge trigger flip/flop and a clock input terminal to receive the first clock signal;
    a first one-way differential circuit having an input terminal to receive the first clock signal, a non-inverted output terminal and an inverted output terminal;
    a second one-way differential circuit having an input terminal connected to the output terminal of the first dual-edge trigger flip/flop, a non-inverted output terminal and an inverted output terminal;
    a third one-way differential circuit having an input terminal connected to an output terminal of the second dual-edge trigger flip/flop, a non-inverted output terminal and an inverted output terminal;
    a first AND gate having a first input terminal connected to the non-inverted output terminal of the first one-way differential circuit and a second output terminal connected to the inverted output terminal of the second one-way differential circuit, thereby generating the first up-adjustment signal; and
    a second AND gate having a first input terminal connected to the non-inverted output terminal of the second one-way differential circuit and a second output terminal connected to the inverted output terminal of the third one-way differential circuit, thereby generating the first down-adjustment signal.

7. The device as claimed in claim 1, wherein the frequency of the data signal is 3 GHz.

8. A data recovery device using a sampling clock with a half frequency of data rate, comprising:
    a phase detection circuit, which receives a data signal and a first clock signal for generating a first and a second up-adjustment signals and first and second down-adjustment signals, wherein a frequency of the data signal doubles that of the first clock signal;
    a charge pump, which generates four currents in accordance with the first and the second up-adjustment signals and the first and the second down-adjustment signals and further outputs a control voltage, wherein the second up-adjustment signal, the first and the second down-adjustment signals control the same current that is different from the current of the first up-adjustment signal; and
    a double clock frequency oscillation circuit, which generates the first clock signal with an adjustment phase in accordance with the control voltage.

9. The device as claimed in claim 8, wherein the current of the first up-adjustment signal is double of the first down-adjustment signal.

10. The device as claimed in claim 9, wherein the charge pump further comprises:
   a first charge pump having an output terminal;
   a second charge pump having an output terminal connected to the output terminal of the first charge pump; and
   a capacitor having one terminal connected to the ground and the other terminal connected to the output terminals of the first and the second charge pumps, thereby generating the control voltage.

11. The device as claimed in claim 10, wherein the first charge pump comprises:
   a first current source;
   a first PMOS transistor having a source connected to an output terminal of the first current source and a gate connected to the first up-adjustment signal;
   a second PMOS transistor having a source connected to the output terminal of the first current source and a gate connected to an inverted first up-adjustment signal;
   an operational amplifier having an input terminal connected to a drain of the second PMOS transistor, the other input terminal and an output terminal both connected to a drain of the first PMOS transistor;
   a first NMOS transistor having a drain connected to the output terminal of the operational amplifier and a gate connected to the first down-adjustment signal;
   a second NMOS transistor having a drain connected to the drain of the second PMOS transistor and a gate connected to inverted first down-adjustment signal; and
   a second current source having an input terminal connected to sources of the first and the second NMOS transistors, wherein the current of the first current source is double of the second current source.

12. The device as claimed in claim 10, wherein the second charge pump comprises:
   a first current source;
   a first PMOS transistor having a source connected to an output terminal of the first current source and a gate connected to the second up-adjustment signal;
   a second PMOS transistor having a source connected to the output terminal of the first current source and a gate connected to an inverted second up-adjustment signal;
   an operational amplifier having an input terminal connected to a drain of the second PMOS transistor, the other input terminal and an output terminal both connected to a drain of the first PMOS transistor;
   a first NMOS transistor having a drain connected to the output terminal of the operational amplifier and a gate connected to the second down-adjustment signal;
   a second NMOS transistor having a drain connected to the drain of the second PMOS transistor, as an output terminal, and a gate connected to inverted second down-adjustment signal; and
   a second current source having an input terminal connected to sources of the first and the second NMOS transistors, wherein the current of the first current source is double of the second current source.

13. The device as claimed in claim 8, wherein the double clock frequency oscillation circuit further comprises:
   a clock generator, which receives the control voltage and accordingly generates a plurality of second clock signals with different phases; and
   a double clock frequency circuit, which receives the second clock signals for accordingly adjusting phase of the first clock signal.

14. The device as claimed in claim 13, wherein a count of the second clock signals is 8.

15. The device as claimed in claim 13, wherein the double clock frequency circuit applies quadruple clock frequency to the second clock signals for generating the first clock signal.

16. The device as claimed in claim 8, wherein the phase detection circuit comprises:
   a first dual-edge trigger flip/flop having an input terminal to receive the data signal and a clock input terminal to receive the first clock signal;
   a second dual-edge trigger flip/flop having an input terminal connected to an output terminal of the first dual-edge trigger flip/flop and a clock input terminal to receive the first clock signal;
   a third dual-edge trigger flip/flop having an input terminal connected to an output terminal of the second both edge trigger flip/flop and a clock input terminal to receive the first clock signal;
   a fourth both edge trigger flip/flop having an input terminal connected to an output terminal of the third both edge trigger flip/flop and a clock input terminal to receive the first clock signal;
   a first one-way differential circuit having an input terminal to receive the first clock signal, a non-inverted output terminal and an inverted output terminal;
   a second one-way differential circuit having an input terminal connected to the output terminal of the first dual-edge trigger flip/flop, a non-inverted output terminal and an inverted output terminal;
   a third one-way differential circuit having an input terminal connected to an output terminal of the second dual-edge trigger flip/flop, a non-inverted output terminal and an inverted output terminal;
   a fourth one-way differential circuit having an input terminal connected to an output terminal of the third dual-edge trigger flip/flop, a non-inverted output terminal and an inverted output terminal;
   a fifth one-way differential circuit having an input terminal connected to an output terminal of the fourth dual-edge trigger flip/flop, a non-inverted output terminal and an inverted output terminal;
   a first AND gate having a first input terminal connected to the non-inverted output terminal of the first one-way differential circuit and a second output terminal connected to the inverted output terminal of the second one-way differential circuit, thereby generating the first up-adjustment signal; and
   a second AND gate having a first input terminal connected to the non-inverted output terminal of the second one-way differential circuit and a second output terminal connected to the inverted output terminal of the third one-way differential circuit, thereby generating the first down-adjustment signal;
   a third AND gate having a first input terminal connected to the non-inverted output terminal of the third one-way differential circuit and a second output terminal connected to the inverted output terminal of the fourth one-way differential circuit, thereby generating the second down-adjustment signal; and
   a fourth AND gate having a first input terminal connected to the non-inverted output terminal of the fourth one-way differential circuit and a second output terminal connected to the inverted output terminal of the fifth one-way differential circuit, thereby generating the second up-adjustment signal.

17. The device as claimed in claim 8, wherein the frequency of the data signal is 3 GHz.

* * * * *